(12) United States Patent
Kim (10) Patent No.: US 6,967,382 B2
(45) Date of Patent: Nov. 22, 2005

(54) INTEGRATED CIRCUIT DEVICES INCLUDING RAISED SOURCE/DRAIN STRUCTURES HAVING DIFFERENT HEIGHTS

(75) Inventor: Ji-young Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/457,159

(22) Filed: Jun. 9, 2003

(65) Prior Publication Data

US 2003/0230811 A1 Dec. 18, 2003

(30) Foreign Application Priority Data

Jun. 12, 2002 (KR) .................................. 10-2002-0032973

(51) Int. Cl.[7] .......................... H01L 29/76; H01L 29/94; H01L 31/062; H01L 31/113; H01L 31/119
(52) U.S. Cl. ...................... 257/377; 257/385; 257/296
(58) Field of Search ............................... 257/385, 381, 257/365, 296, 377, 758

(56) References Cited

U.S. PATENT DOCUMENTS

| | | | | |
|---|---|---|---|---|
| 6,346,447 B1 | * | 2/2002 | Rodder | 438/300 |
| 6,570,222 B2 | * | 5/2003 | Nozaki et al. | 257/347 |
| 6,608,354 B2 | * | 8/2003 | Hokazono et al. | 257/382 |
| 6,744,104 B1 | * | 6/2004 | Aoki et al. | 257/372 |

* cited by examiner

*Primary Examiner*—Phat X. Cao
(74) *Attorney, Agent, or Firm*—Myers Bigel Sibley & Sajovec, PA (57) ABSTRACT

Integrated circuit devices including raised source/drain structures having different heights are disclosed. An integrated circuit device can include a first raised source/drain structure having a first height above a substrate in a first region of the integrated circuit including devices formed at a first density. The integrated circuit device can further include a second raised source/drain structure having a second height that is greater than the first height in a second region of the integrated circuit including second devices formed at a second density that is less than the first density.

9 Claims, 6 Drawing Sheets

INTEGRATED CIRCUIT DEVICES INCLUDING RAISED SOURCE/DRAIN STRUCTURES HAVING DIFFERENT HEIGHTS

RELATED APPLICATION

This application claims the benefit of Korean Patent Application No. 2002-0032973, filed Jun. 12, 2002, the disclosure of which is he rely incorporated herein by reference in its entirety as if set forth fully herein.

FIELD OF THE INVENTION

The present invention relates to methods of forming integrated circuit devices and devices so formed, and more particularly, to methods of forming raised source/drain structures in integrated circuit devices and to structures so formed.

BACKGROUND

As integrated circuit devices (e.g., semiconductor devices) become more highly integrated, an associated design rule may be reduced. As a result, the area occupied by the integrated circuit device may also be reduced, which may make it more difficult to form transistors therein. For example, NMOS transistors in a cell region of a memory device and PMOS and NMOS transistors in a peripheral circuit region are fabricated to have predetermined lengths so as to provide the electrical characteristics of these transistors. However, short channel effects associated with the reduced size of the transistors may result in the malfunction of a transistor device.

It is known to increase channel length by forming a raised source/drain using selective epitaxial growth. An epitaxy layer can be formed to a predetermined thickness on a portion of substrate where source/drain junctions are formed so that the resultant structure is higher than the substrate (i.e., a raised source/drain structure). The raised source/drain structure can effectively increase the channel length, thereby reducing short channel effects.

However, the thickness of the raised source/drain structure can also influence the efficacy of the transistor in other ways. For example, if the raised source/drain structure is too thick, the raised source/drain structure may cause an electrical short between the structure and a gate electrode. On the other hand, if the raised source/drain structure is too thin, the raised source/drain structure may not be effective enough in reducing the short channel effects.

SUMMARY

Embodiments according to the invention can provide integrated circuit devices that include raised source/drain structures having different heights. Pursuant to these embodiments, an integrated circuit device can include a first raised source/drain structure having a first height above a substrate in a first region of the integrated circuit including devices formed at a first density. The integrated circuit device can further include a second raised source/drain structure having a second height that is greater than the first height in a second region of the integrated circuit including second devices formed at a second density that is less than the first density.

In some embodiments according to the invention, the first raised source/drain structure can include a single raised source/drain structure layer having the first height and the second raised source/drain structure can include a first raised source/drain structure layer having a third height that is less than the first height.

In some embodiments according to the invention, the second raised source/drain structure can further include a second raised source/drain structure layer on the first source/drain structure layer to provide a multilayered raised source/drain structure having the second height. In some embodiments according to the invention, the first and second raised source/drain structures can include first and second selectively epitaxially grown (SEG) silicon layers.

In some embodiments according to the invention, the first region can be a memory cell region of an integrated circuit memory device and the second region can be a peripheral region of the integrated circuit memory device.

The present invention provides an integrated circuit device in which epitaxial silicon layers are formed to different thicknesses at the source/drain junctions of a cell region and a peripheral circuit region that have different threshold voltages and design rules, thereby preventing short circuiting fail due to epitaxial overgrowth in the cell region of a fine design rule and preventing the short channel effect occurring in the peripheral circuit region, and a method of fabricating the same.

According to one aspect of the present invention, there is provided an integrated circuit device including isolation insulating layers for defining a first active region and second active regions on an integrated circuit substrate; gates on which a gate insulating layer, a gate conductive layer, and an mask insulating layer are sequentially deposited, the gate having insulating layer spacers on its sidewalls; source and drain regions formed between the gates on the integrated circuit substrate; a first silicon layer formed to a predetermined thickness on the source and drain regions of the first active region and the second active regions; a second silicon layer formed on the first silicon layer on the source and drain regions of the second active regions; and source and drain junctions formed on the first and second silicon layers.

The second active regions may have a CMOS structure that includes a PMOS region and an NMOS region. The first active region is a region having a device forming region of a fine design rule, in which an NMOS transistor is formed. For instance, the first active region may be a cell region in which a memory device of an integrated circuit memory device is formed. The second active region is a peripheral region of a wider design rule, which has a low threshold voltage Vt and in which PMOS and NMOS transistors of high junction concentration are formed.

The first silicon layer is a silicon epitaxy layer that is selectively formed on a silicon source using the gate and the isolation insulating layer as a self-aligning insulating mask. The second silicon layer is a selective epitaxial growth (SEG) layer that is selectively formed with the first silicon layer as a seed layer, or a selective poly-silicon growth (SPG) layer that is selectively formed with the first silicon layer as a seed layer. Preferably, a metal silicide layer is further formed on the second silicon layer in the second active regions, thereby increasing contact conductivity. The metal silicide layer may be formed of one selected from a group of titanium silicide (TiSi), cobalt silicide (CoSi), moly silicide (MoSi), and nickel silicide (NiSi).

According to another aspect of the present, there is provided a method of fabricating an integrated circuit device, including (a) defining a first active region, and second active regions, which include PMOS region and an NMOS region, on an integrated circuit substrate; (b) forming gates in the first and second active regions; (c) forming source and drain junctions in the first active region; (d) selectively forming a first silicon layer to protrude to a predetermined thickness from the surface of device forming regions of the first and second active regions using a self-aligning method; (e) selectively forming a second silicon layer on the first silicon layer in the device forming regions of the second active regions, using the self-aligning method; and (f) forming PMOS and NMOS source and drain junctions in the second active regions.

Defining the first active region comprises forming an isolation insulating layer on the integrated circuit substrate.

Forming gates comprises sequentially forming a gate insulating layer and a gate conductive layer on the device forming region; forming a mask insulating layer on the gate conductive layer; forming a gate pattern on the mask insulating layer, which acts as a mask, and the gate conductive layer; and forming spacers along the sidewalls of the gate pattern and the mask insulating layer. The gate conductive layer comprises impurity-doped polycrystalline silicon and the mask insulating layer is formed of a silicon oxide layer or a silicon nitride layer by chemical vapor deposition (CVD). The spacer is a silicon oxide layer or a silicon nitride layer that is formed by CVD. However, preferably, the spacer is a silicon oxider layer to increase growth selectivity during the subsequent selective growth of silicon.

After the formation of the gates, implanting lightly doped drain (LDD) channel ions may be implanted into the second active regions to increase the threshold voltage characteristics of a transistor. Preferably, implanting the LDD channel ions is performed only in the NMOS region of the second active regions, thereby reducing the threshold voltage of the NMOS transistor.

Forming the first silicon layer comprises exposing a silicon substrate in the source and drain regions formed on the device forming regions of the first and second active regions; and selectively forming a first silicon layer to a predetermined thickness only on the source and drain regions.

Exposing the silicon substrate is performed by dry etching, which uses self-alignment with the gate and the isolation insulating layer which act as masks. A wet cleaning process may be performed using a etching solution containing an HF solution to remove the dielectric layer formed at the source and drain regions and a natural oxide layer remaining on the source and drain regions. The first silicon layer, which is an epitaxial silicon layer, is deposited with the silicon substrate exposed between the source and drain regions as a seed layer, using chemical vapor deposition. The first silicon layer is formed using low-pressure chemical vapor deposition, and a selective epitaxial growth is used so that silicon is grown on the silicon substrate, not on the silicon dielectric layer.

Forming the second silicon layer in the second active region comprises forming an insulating blocking layer in the first active region and exposing the first silicon layer formed on the source and drain regions of the second active regions; and forming a second silicon layer on the exposed first silicon layer on the source and drain regions of the second active regions. The insulating blocking layer is a silicon oxide layer obtained by CVD. The second silicon layer is formed of epitaxial silicon obtained by selective epitaxial growth (SEG) or is formed of polycrystalline silicon obtained by selective poly-silicon growth (SPG).

Forming the source and drain junctions in the second active region comprises forming a photoresist pattern to cover the first active region and the PMOS region of the second active regions of the integrated circuit substrate; implanting ions for NMOS source and drain junctions into the NMOS region of the second active regions using the photoresist pattern as a mask; forming a photoresist pattern to cover the first active region and the NMOS region of the second active regions; and implanting ions for PMOS source and drain junctions into the PMOS region of the second active region using the patterned photoresist as a mask. The ions for NMOS source and drain junctions implanted into the second active region are formed of one selected from a group of phosphorous (P), arsenic (As), and antimony (Sb). The ions for PMOS source and drain junctions implanted into the second active region are formed of one selected from a group of boron (B) and boron fluoride ($BF_2$).

After forming the source and drain junctions, the method according to the present invention further including exposing the second silicon layer on the source and drain regions of the PMOS and NMOS regions of the second active regions; forming a silicide source metal layer on the entire surface of the integrated circuit substrate; and forming a silicide layer on the silicide source metal layer and the second silicon layer, which contacts the silicide source metal layer, by performing a heating process thereon. The silicide source metal layer is formed of one selected from a group of titanium (Ti), cobalt (Co), molybdenum (Mo), and nickel (Ni).

As described above, according to the present invention, when forming MOS transistors in a cell region, which is a first active region, and a peripheral circuit region, which is a second active region, epitaxy layers are formed to different thicknesses at the source and drains of the cell region and peripheral circuit region according to the characteristics of the MOS transistor. Accordingly, it is possible to prevent the short channel effect in a transistor of a peripheral circuit region of higher junction concentration and, further, fabricate an integrated circuit device having a region of a high-density design rule, such as a cell region, in which short circuiting does not occur.

DESCRIPTION OF EMBODIMENTS ACCORDING TO THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present, It will be understood that when an element such as a layer, region or substrate is referred to as "under" another element, it can be directly under the other element or intervening elements may also be present, It will be understood that when part of an element, such as surface of a conductive line, is referred to as "outer", it is closer to the outside of the integrated circuit than other parts of the element. Like numbers refer to like elements throughout.

Furthermore, relative terms, such as beneath, may be used herein to describe one layer's or regions's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to described various regions, layers and/or section, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 1:
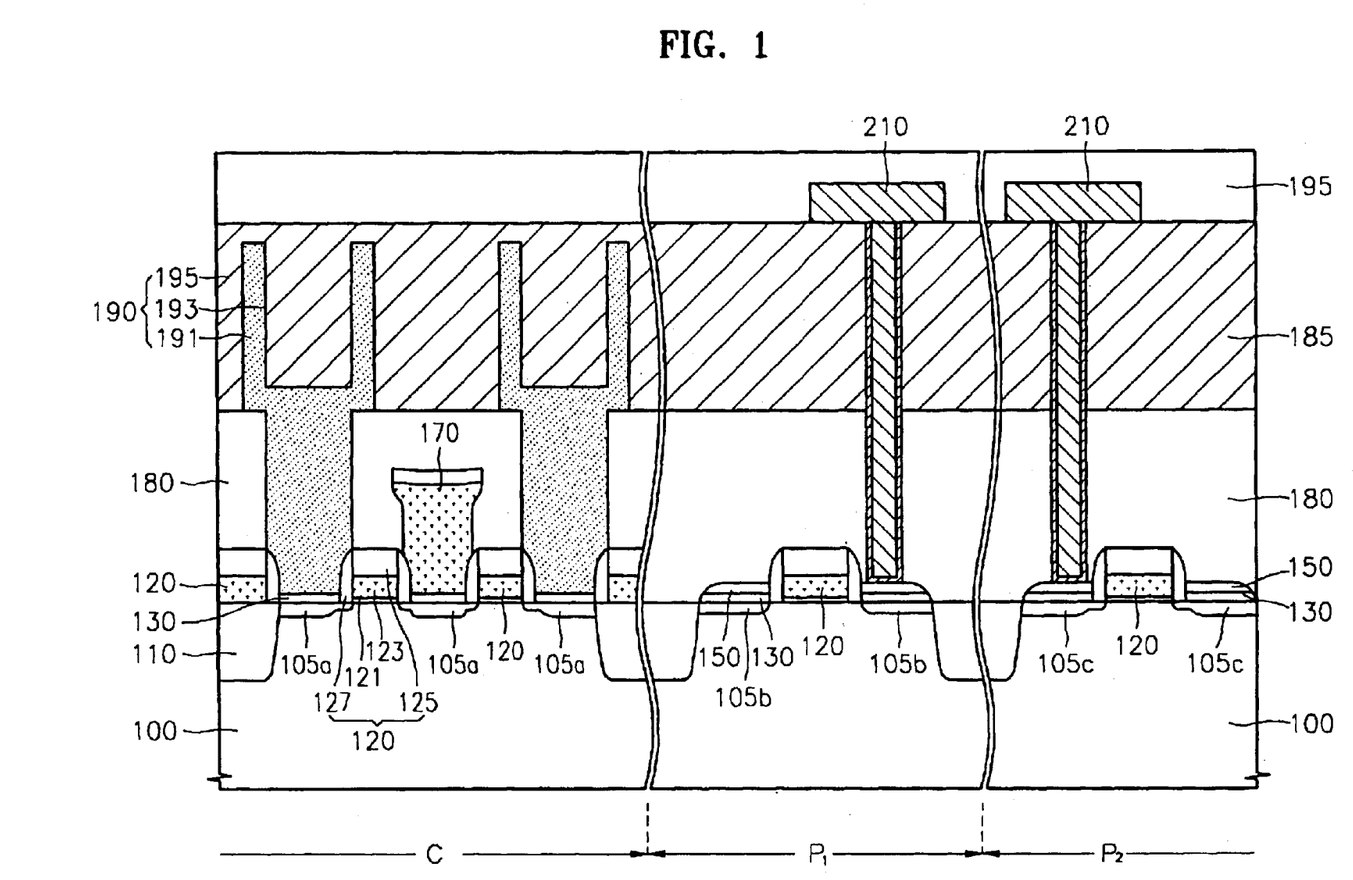
FIG. 1 is a cross-sectional view that illustrates embodiments of integrated circuit devices according to the invention.
Figure 2:
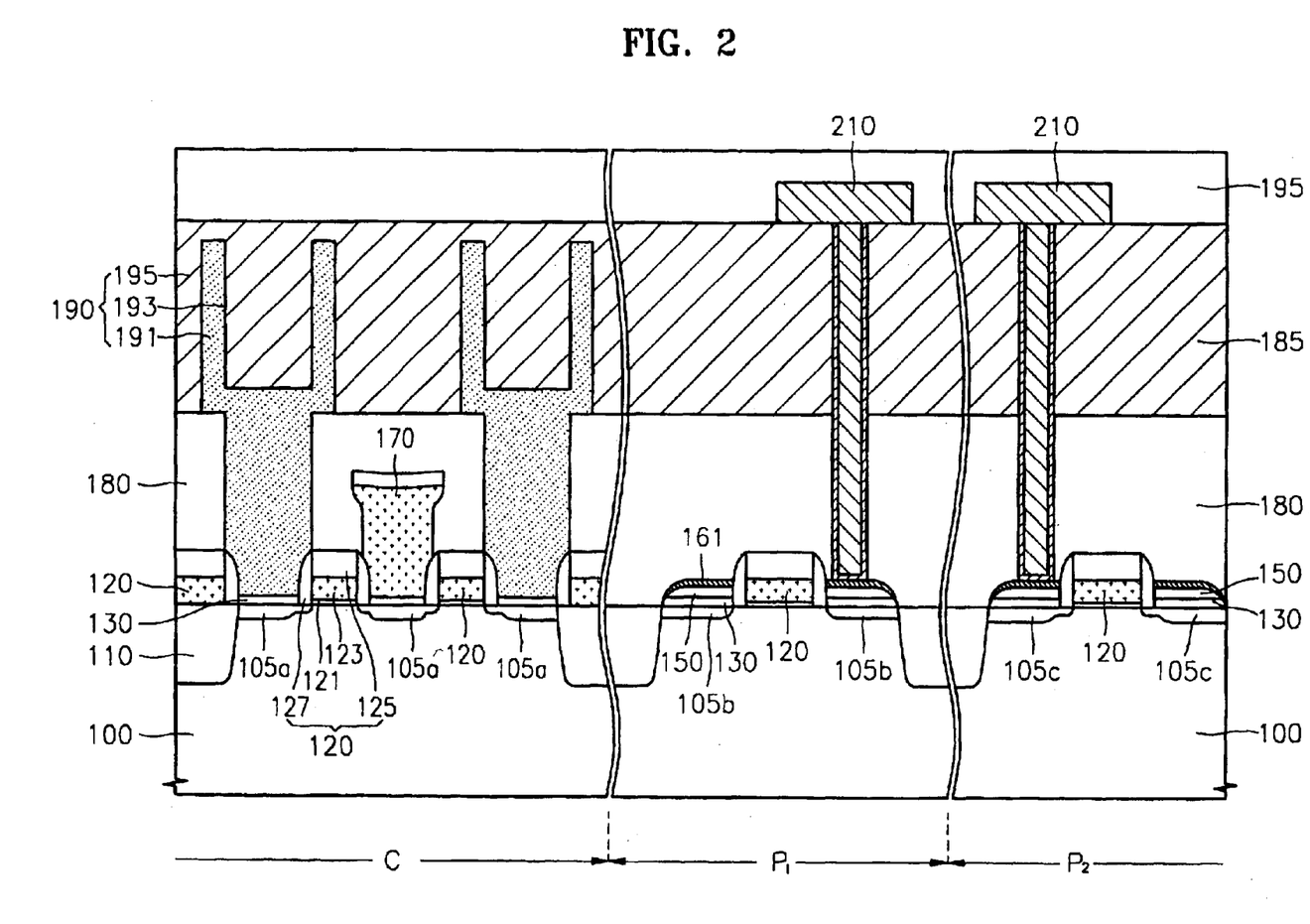
FIG. 2 is a cross-sectional view that illustrates embodiments of integrated circuit devices according to the invention.

FIGS. 1 and 2 are cross-sectional views that illustrate embodiments of integrated circuit devices according to the invention. Referring to FIG. 1, a substrate 100 includes a first active region C and second active regions $P_1$ and $P_2$. Isolation insulating layers 110 define active areas of the substrate between transistors. Gates 120 include a gate dielectric layer 121 and a gate conductive layer 123. First silicon layers 130 are on source/drain regions 105a–c between the gates 120 in the first and second active regions C, and $P_1$ and $P_2$. Second silicon layers 150 are formed on the first silicon layers 130 located in the second active regions $P_1$ and $P_2$. However, the second layers 150 are absent from the first active region C.

Capacitors 190 are electrically coupled to the source/drain regions 105a in the first active region C. The capacitor 190 includes a storage electrode 191, a dielectric layer 193, and a plate electrode 195. Metal interconnections 210 are electrically coupled to the source/drain regions 105b and 105c in the second active regions $P_1$ and $P_2$. In the case of a memory device, the first active region C can be in a cell region having a relatively small design rule whereas the second active regions $P_1$ and $P_2$ can be in peripheral circuit regions around the cell region C.

The isolation insulating layer 110 can be formed of silicon oxide. In some embodiments according to the invention, an integrated circuit device having a small design rule comprises an isolation insulating layer 110 which is formed using a trench isolation technique by, for example, forming a trench in the integrated circuit substrate 100, which is filled with a silicon insulating layer. In some embodiments according to the invention, the gate dielectric layer 121 is a silicon oxide layer or an oxy nitride layer, although other materials can be used. The gate conductive layer 123 is formed of impurity-doped polycrystalline silicon. A gate conductive layer 123 can include a metal silicide layer (not shown) to reduce the electrical resistance. In some embodiments according to the invention, the metal silicide layer is formed of moly silicide (MoSi) or nickel silicide (NiSi), but preferably, Ti silicide (TiSi) or cobalt silicide (CoSi), although other materials may also be used.

An insulating layer 125 and an insulating layer spacer 127 are on the gate 120. In some embodiments according to the invention, the insulating layer 125 is formed of a silicon insulating layer and is used as a mask when forming a gate pattern and a contact hole for self-alignment during a subsequent process. The insulating layer spacer 127 on the sidewalls of the gate 120 may reduce or prevent the short channel effects.

The first silicon layers 130 are formed on the silicon substrate 100 on the source/drain regions 105a of the first active region C and on the source/drain regions 105b–c in the second active regions $P_1$ and $P_2$ of the integrated circuit substrate 100. In some embodiments according to the invention, the first silicon layer 130 is formed of epitaxial silicon using chemical vapor deposition (CVD). In some embodiments according to the invention, the first silicon layer 130 is formed using atmospheric or low-pressure CVD. The epitaxy layer is formed using selective epitaxial growth (SEG), which is used to "selectively" grow a layer on a portion of a silicon material whereas no growth is provided on a silicon insulating layer. Here, the gate 120 and the isolation insulating layer 110 are used as masks for the SEG.

The second silicon layers 150 are formed on the first silicon layers 130 in the second active regions $P_1$ and $P_2$. In particular, each second silicon layer 150 is formed of epitaxial silicon of single crystal or polycrystalline silicon on the first silicon layer 130 on the source/drain regions 105b–c. The epitaxial silicon or polycrystalline silicon is formed using CVD and is also formed using selective silicon film growth so that the epitaxial silicon or polycrystalline silicon is grown in the first silicon layer 130. That is, the epitaxial silicon is grown on the exposed silicon material (130) in the active regions $P_1$ and $P_2$ but is absent from the first silicon 130 in active region C.

FIG. 2 is a cross-sectional view that illustrates embodiments of integrated circuit devices according to the invention. The integrated circuit device of FIG. 2 is similar to that illustrated in FIG. 1, however, metal silicide layers are shown on the second silicon layers 150 in the second active regions $P_1$ and $P_2$ but are absent from the first silicon 130 in active region C.

Figure 3:
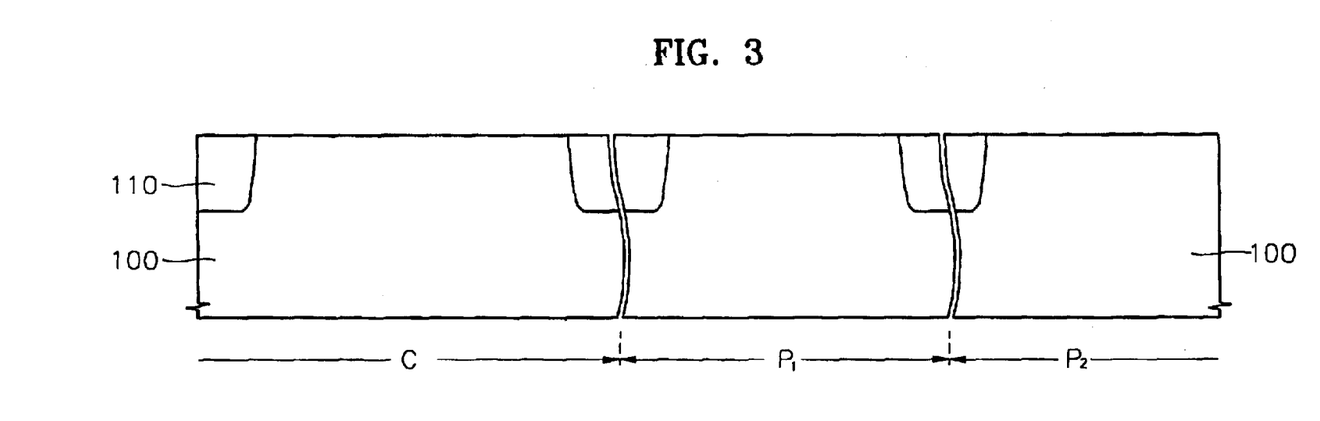
FIGS. 3 through 7 are cross-sectional views illustrating method embodiments of forming integrated circuit devices according to the invention.

FIGS. 3 through 7 are cross-sectional views that illustrate method embodiments of forming integrated circuit devices according to the invention. Referring to FIG. 3, isolation insulating layers 110 are formed on an integrated circuit substrate 100 to define an exposed device region in which devices can be formed (i.e., a device region). Each isolation insulating layer 110 is formed of a silicon oxide layer using a general trench isolation method or a modified element isolation method based on the general trench isolation method.

Figure 4:
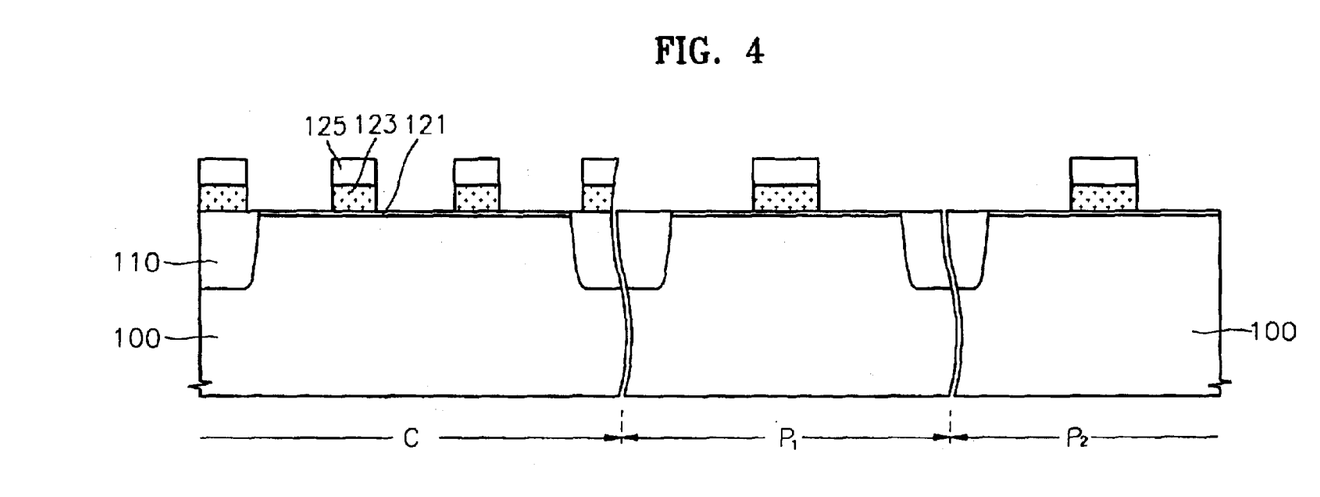

Referring to FIG. 4, gates 120 are formed on the device region of the integrated circuit substrate 100. For example, a gate insulating layer 121 is formed on the device region and gate conductive layers 123 and insulating layers 125 are sequentially formed as a mask on the gate insulating layers 121. A patterning process is performed on the insulating layer 125 and the gate conductive layer 123 to pattern the gate 120.

In some embodiments according to the invention, the gate insulating layer 125 is formed of a silicon oxide layer ($SiO_2$) or oxy nitride layer (SiON) that can be made by oxidizing the underlying silicon. In some embodiments according to the invention, the gate conductive layer 123 is formed of impurity-doped polycrystalline silicon using low-pressure CVD. In some embodiments according to the invention, the gate conductive layer 123 further includes a metal silicide layer (not shown) that may increase gate conductivity.

Figure 5:
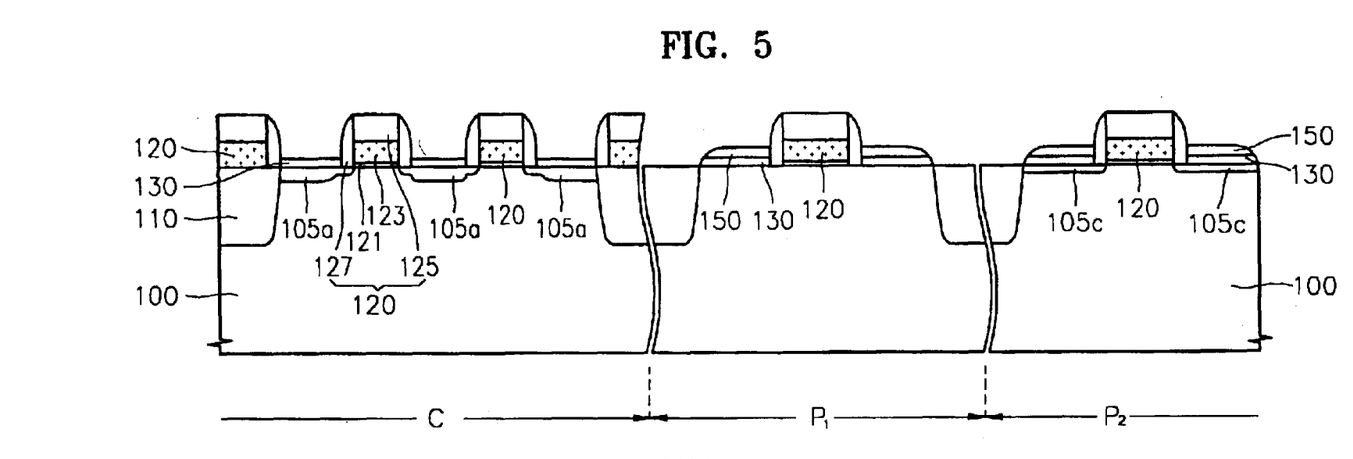

Referring to FIG. 5, ions are implanted into the substrate 100 using the patterned gate 120 as a mask to form N-region of source/drain regions 105a in the first active region C. A photoresist pattern (not shown) is formed on the integrated circuit substrate 100, which exposes the first active region C. Ions are implanted into the exposed first active region C, using an ion implantation method. In some embodiments according to the invention, N-type phosphorous (P) ions are implanted at a relatively low concentration to form an NMOS transistor. The ions can be shallowly implanted into the first active region C. After implanting the junction impurity ions, the photoresist pattern is removed by a cleaning process. A photoresist pattern (not shown) is formed on the integrated circuit substrate 100, which exposes the second active region P2. Ions are implanted into the exposed second active region P2, using an ion implantation method. In some embodiments according to the invention, N-type arsenic (As) ions are implanted to form an N-region of the source/drain regions 105c. After implanting the junction impurity ions, the photoresist pattern is removed by the cleaning process.

A silicon insulating layer is formed on the integrated circuit substrate 100 and dry etched from the substrate 100 thereby allowing the insulating layer spacer 127 to remain on the sidewalls of the gate 120. In some embodiments according to the invention, the insulating layer spacer 127 is formed of a silicon oxide layer or a silicon nitride layer. However, for high deposition selectivity, it is preferable for the insulating layer spacer 127 to be formed of a silicon oxide layer to be used as a mask during a selective epitaxial growth (SEG) process or selective poly-silicon growth (SPG) process. A photoresist pattern (not shown) is formed on the integrated circuit substrate 100, which exposes the first active region C. Ions are implanted into the exposed first active region C, using an ion implantation method. In some embodiments according to the invention, N-type arsenic (As) ions are implanted to form an N+ region of the source/drain regions 105a. After implanting the junction impurity ions, the photoresist pattern is removed by a cleaning process.

The gate dielectric layer 121 and a remnant oxide layer remaining on the source/drain regions 105a–c are removed by a cleaning process, thereby exposing the source/drain regions of the device. As a result, the conductive surfaces of the source/drain regions 105a–c are exposed (i.e., are not covered by an insulator layer pattern, such as the combined coverage of the insulating layer spacer 127, the isolation insulating layers 110, and the insulating layer 125).

Preferably, the first silicon layer 130 is a single-crystal epitaxy layer that is formed of silicon of single crystals using the SEG process, to enhance the electrical characteristics of an device. The SEG process can utilize a silicon source gas of DCS($SiH_2Cl_2$), $SiCl_4$, $SiH_4$, and $SiHCl_3$. In addition, a large amount of hydrogen ($H_2$) gas may be used as a carrier for the silicon source gas, and hydrochloric acid (HCl) gas can be used as a selective etching gas during the selective deposition. In general, an epitaxy layer is formed at a temperature in a range between about 900° C. and about 1100° C.

Figure 6:
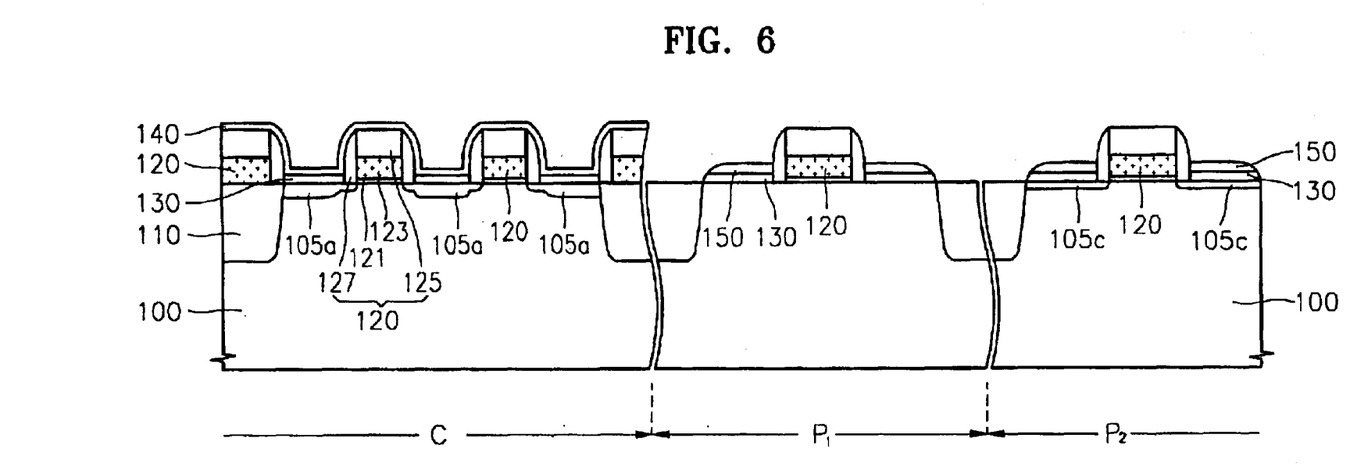

Referring to FIG. 6, an insulating block layer 140 is first formed on the entire surface of the integrated circuit substrate 100. The insulating block layer 140 is formed of s silicon oxide layer, e.g., an MTO, HTO, or TEOS oxide layer that is formed by CVD. A photolithography process is performed on the resultant structure to form a photoresist pattern, whereby the first active region C is covered with the photoresist pattern but the second active regions $P_1$ and $P_2$ are exposed. Thereafter, the insulating block layer 140 on the second active regions $P_1$ and $P_2$ is removed through an etching process to expose the surface of the first silicon layer 130 in those regions. As a result, the first active region C is covered with the insulating block layer 140 but the first silicon layers 130 in the second active regions $P_1$ and $P_2$ are exposed.

After cleaning the substrate, a second silicon layer 150, of epitaxial silicon or polycrystalline silicon, is formed on the first silicon layer 130, which acts as a seed layer, using a selective silicon layer deposition method such as the SEG or SPG process to provide a second layer of the raised source/drain structure in the second active regions $P_1$ and $P_2$. Therefore, the first silicon layer 130 is formed on the source and drain regions of the first active region C, whereas both the first and second silicon layers 130 and 150 are formed in the second active regions $P_1$ and $P_2$. As a result, the combination of the first and second silicon layers in the second active regions $P_1$ and $P_2$ provides a multilayered raised source/drain structure that is thicker than that in the raised source/drain structure in the first active region C. The thicknesses of the first and second silicon layers 130 and 150 may be determined based on the desired electrical characteristics of the MOS transistors to be formed. The first silicon layer 130 in the second active regions P1 and P2 is slightly eteched away by the cleaning which is performed prior to the formation of the second silicon layer 150.

Accordingly, the thickness of the first silicon layer 130 in the second active regions P1 and P2 is substantially the same as or less than that of the first silicon layer in the first active region C.

Figure 7:
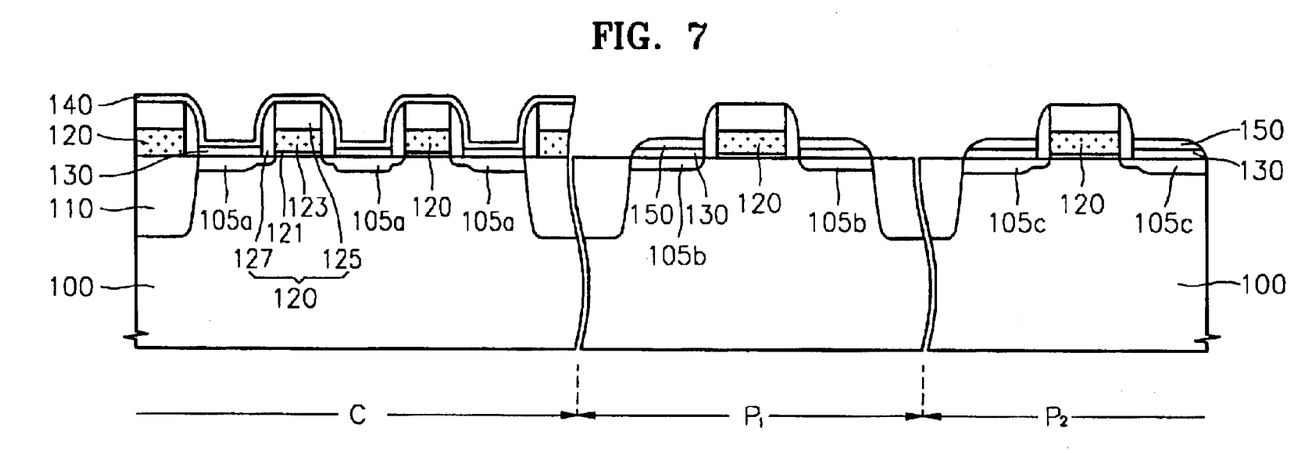

Referring to FIG. 7, source/drain regions 105b–c are formed on the second active regions $P_1$ and $P_2$. In some embodiments according to the invention, the N+ regions of the source/drain regions 105b and N+ region of the source/drain regions 105c in the second active regions $P_1$ and $P_2$ are formed separately where, for example, PMOS devices are to be formed in region $P_1$ and NMOS devices are to be formed in region $P_2$. A photolithography process can be performed on the separate second active regions $P_1$ and $P_2$ to form separate masks for ion implantation into the respective regions. N-type ions and P-type ions are implanted into the NMOS regions $P_1$ and the PMOS region $P_2$, respectively. In the case of a memory device, which is one type of integrated circuit device, capacitors, bit lines, and metal interconnections can be formed to complete an integrated circuit device according to the present invention.

Figure 8:
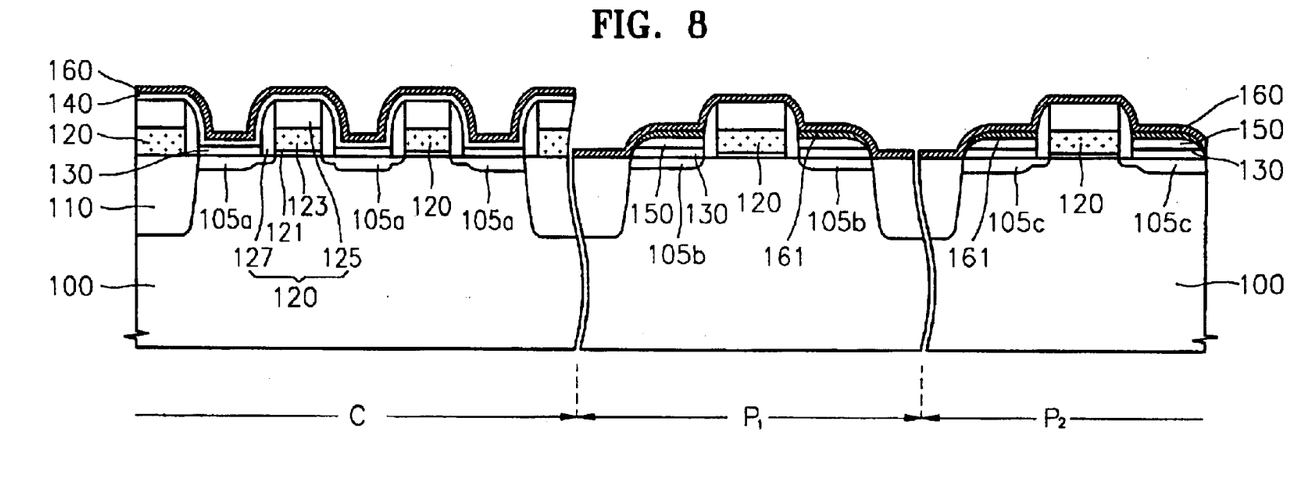
FIGS. 8 and 9 are cross-sectional views illustrating method embodiments of forming integrated circuit devices according to the invention.
Figure 9:
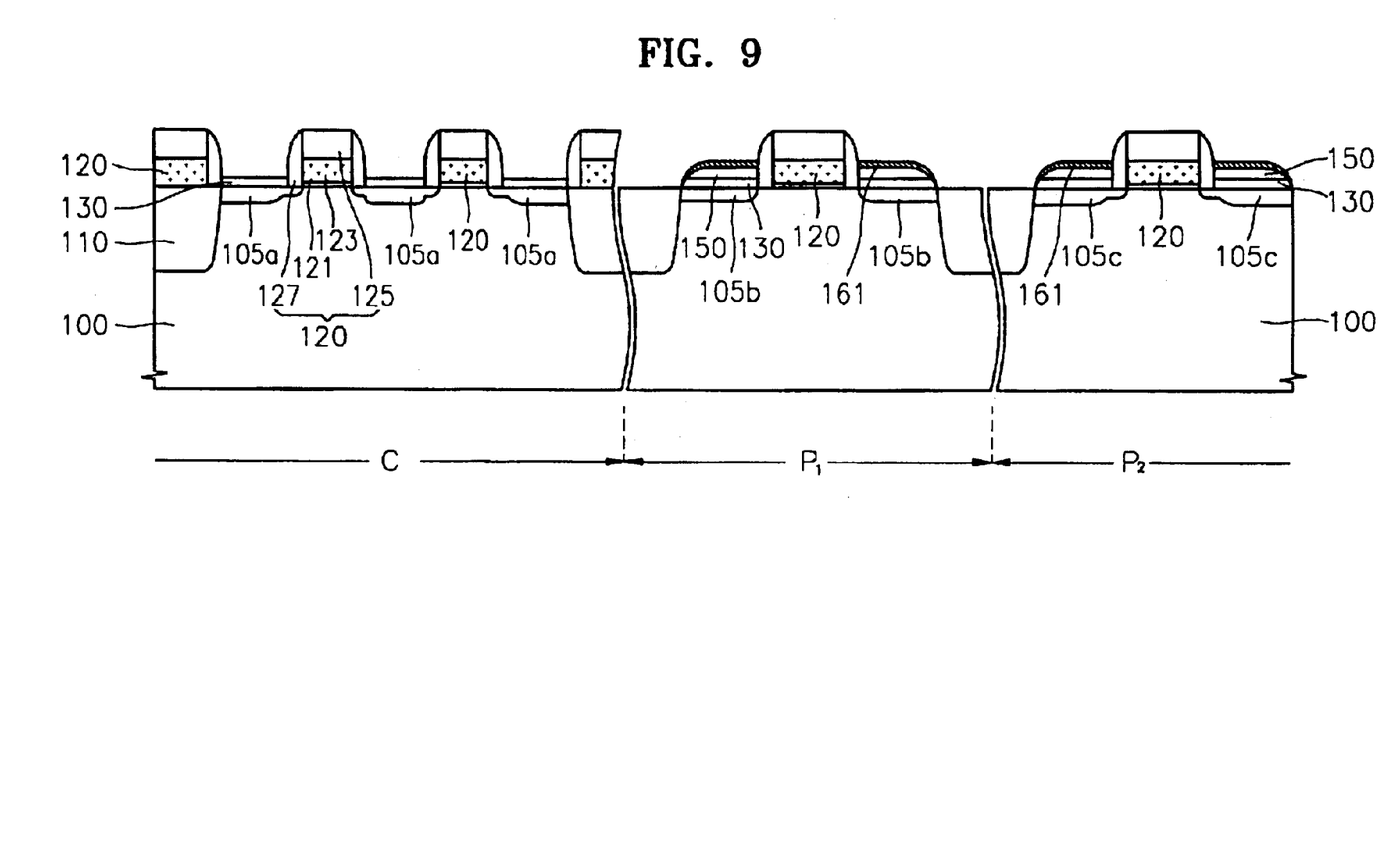

FIGS. 8 and 9 are cross-sectional views that illustrate method embodiments of forming integrated circuit devices according to the invention. FIGS. 8 and 9 further illustrate forming a metal silicide layer 161 on the source/drain regions.

Referring to FIG. 8, after completing the processes illustrated by FIGS. 3 through 7, a silicide source metal layer 160 is deposited on the entire surface of the integrated circuit substrate 100 including a first active region C, which is coated with the insulating block layer 140. In some embodiments according to the invention, the silicide source metal layer 160 is formed of titanium (Ti), cobalt (Co), molybdenum (Mo), or nickel (Ni). As a result, the second silicon layer 150, which is formed on the source/drain regions 105b–c of the second active regions $P_1$ and $P_2$, contacts the silicide source metal layer 160.

A heating process is performed on the integrated circuit substrate 100 covered with the silicide source metal layer 160 so the second silicon layer 150 reacts with the silicide source metal layer 160, thereby forming a metal silicide layer 161 on the second silicon layer 150 in the second active regions $P_1$ and $P_2$. The silicon source in the second silicon layer 150 undergoes a silicide reaction with the silicide source metal layer 160 due to the heating process, thereby causing the metal silicide layer 161 to be formed on the second silicon layer 150. In some embodiments according to the invention, the silicide source metal layer 160 is formed of Ti silicide (TiSi) or cobalt silicide (CoSi).

In some embodiments according to the invention, the metal silicide layer 161 may also be formed in the first active region C. In this case, after completing all of the processes with respect to FIGS. 3 through 7, the insulating block layer 140 in the first active region C is removed, and a silicide process is performed in the first active region C as described with reference to FIG. 8.

Referring to FIG. 9, the remnant silicide source metal layer 160 that does not react with the second silicon layer 150 and remains during the heating process, is removed by wet etching. More specifically, the remnant silicide source metal layer 160 on the insulating block layer 140 in the first active region C and, the gate 120 and the isolation insulating layer 110 in the second active regions P1 and P2, is removed using an etching solution such as a sulfuric acid (H2SO4) solution or ammonium hydroxide (NH$_4$OH) solution. As a result, the metal silicide layer 161 is formed on the second silicon layer 150 on the source/drain regions. In general, the metal silicide layer 161 has lower resistivity than an impurity-doped silicon junction. Accordingly, the contact resistance of a contact used to provide interconnection between layers can be lowered.

According to embodiments of the invention, the thicknesses of the silicon layers 130 and 150, on the source/drain regions of the first active region C and the second active regions $P_1$ and $P_2$, can be determined based on the characteristics, such as the density and the design rule, of the respective active regions. In particular, the silicon layer 130 can be thin in the first active region C having devices that are more closely spaced compared to other regions of the integrated circuit device (i.e., higher density) to prevent short circuits between devices or structures therein. In contrast, the combination of the first and second silicon layers 130 and 150 in the second active regions $P_1$ and $P_2$, can be thicker than the first silicon layer 130 in the first active region C. As discussed above, it may be advantageous to form thicker raised source/drain structures in a peripheral region (where devices are formed at lower density) to reduce short channel effect and form thinner raised source/drain structures in a memory cell region (where devices are formed at higher density) to reduce short channel effects and avoid short circuits between adjacent as devices in the second active regions $P_1$ and $P_2$ may be less densely formed, which may reduce or prevent short channel effects.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. An integrated circuit device comprising:
   a first raised source/drain structure having a first height above a substrate in a first region of an integrated circuit including first devices formed at a first density; and
   a second raised source/drain structure having a second height that is greater than the first height in a second region of the integrated circuit including second devices formed at a second density that is less than the first density, wherein the first raised source/drain structure comprises a single raised source/drain structure layer having the first height and the second raised source/drain structure comprises a first raised source/drain structure layer having a third height that is substantially the same as or less than that of the first height.

2. An integrated circuit device according to claim 1 wherein the second raised source/drain structure further comprises a second raised source/drain structure layer on the first raised source/drain structure layer to provide a multi-layered raised source/drain structure having the second height.

3. An integrated circuit device according to claim 1 wherein the first and second raised source/drain structures comprise first and second selectively epitaxially grown (SEG) silicon layers.

4. An integrated circuit device according to claim 1 wherein the first region comprises a memory cell region of an integrated circuit memory device and the second region comprises a peripheral region of the integrated circuit memory device.

5. An integrated circuit device according to claim 1 further comprising:
   a silicide layer on the second raised source/drain structure.

6. An integrated circuit device comprising:
   a single layered raised source/drain structure having a first height above a substrate in a first region of an integrated circuit including first devices formed at a first density; and
   a multilayered raised source/drain structure having a second height that is greater than the first height in a second region of the integrated circuit including second devices formed at a second density that is less than the first density, wherein the multilayered raised source/drain structure comprises:
   a first raised source/drain structure layer having a third height that is substantially the same as or less than that of the first height; and
   a second raised source/drain layer on the first raised source/drain layer to provide the second height to the multilayered raised source/drain structure.

7. An integrated circuit device according to claim 6 wherein the first and second raised source/drain structures comprise first and second selectively epitaxially grown (SEG) silicon layers.

8. An integrated circuit device according to claim 6 wherein the first region comprises a memory cell region of an integrated circuit memory device and the second region comprises a peripheral region of the integrated circuit memory device.

9. An integrated circuit device according to claim 6 further comprising:
   a suicide layer on the multilayered raised source/drain structure.

* * * * *

UNITED STATES PATENT AND TRADEMARK OFFICE
CERTIFICATE OF CORRECTION

PATENT NO. : 6,967,382 B2 Page 1 of 1
DATED : November 22, 2005
INVENTOR(S) : Kim It is certified that error appears in the above-identified patent and that said Letters Patent is hereby corrected as shown below:

Column 10,
Line 64, should read -- a silicide layer on the multilayered raised source/drain --.

Signed and Sealed this

Twenty-first Day of March, 2006

JON W. DUDAS
*Director of the United States Patent and Trademark Office*